United States Patent [19]

Foxall et al.

[11] 4,086,609
[45] Apr. 25, 1978

[54] DOUBLE SPLIT-ELECTRODE FOR CHARGE TRANSFER DEVICE

[75] Inventors: Thomas George Foxall, Carp; Abd-El-Fattah Ali Ibrahim; Lester Porter Sellars, both of Ottawa, all of Canada

[73] Assignee: Northern Telecom Limited, Montreal, Canada

[21] Appl. No.: 752,116

[22] Filed: Dec. 20, 1976

[51] Int. Cl.² .................... H01L 29/78; G11C 19/28; H03H 7/28
[52] U.S. Cl. ................................ 357/24; 307/221 D; 333/70 T
[58] Field of Search ..................... 357/24; 307/221 D; 333/70 T

[56] References Cited

U.S. PATENT DOCUMENTS

| | | | |
|---|---|---|---|
| 3,819,958 | 6/1974 | Gosney | 333/70 T |
| 3,897,282 | 7/1975 | White | 357/24 |
| 3,999,152 | 12/1976 | Sato et al. | 357/24 |
| 4,005,377 | 1/1977 | Engeler | 357/24 |
| 4,032,867 | 6/1977 | Engeler et al. | 307/221 D |

OTHER PUBLICATIONS

Baertsch et al., "The Design and Operation of Practical Charge Transfer Transversal Filters", IEEE Trans. Electron Devices, vol. ED-23, (2/76), pp. 133-142.

Primary Examiner—William D. Larkins
Assistant Examiner—Gene M. Munson
Attorney, Agent, or Firm—John E. Mowle

[57] ABSTRACT

A charge transfer device in which reduced capacitive loading is obtained by utilizing a double split electrode (as opposed to the conventional single split electrode). Charge transferred beneath the double split electrode is differentially sensed by two of the segments. The portion of the total charge beneath the third segment is simultaneously transferred along so as to retain a uniform charge density beneath the electrode as a whole. This device is particularly adapted for transversal filter applications where the differential sensing is relatively small for a large proportion of the electrodes.

5 Claims, 2 Drawing Figures

DOUBLE SPLIT-ELECTRODE FOR CHARGE TRANSFER DEVICE

This invention relates to a charge transfer device for use in transversal filters and the like, and more particularly to one which utilizes a double split in the sensing electrodes of the device to reduce the total electrode capacitance and hence the common mode signal component of the sensed voltages.

BACKGROUND OF THE INVENTION

Charge transfer devies (CTDs) such as CCDs (charge-coupled devices) and BBDs (bucket brigade devices) can be readily used in signal processing applications such as for split-electrode transversal filters. A discussion of the design considerations for such a filter can be found in a paper by Richard D. Baertsch et al. entitled "The Design and Operation of Practical Charge-Transfer Transversal Filters" IEEE Transactions on Electron Devices, Vol. ED-23, No. 2, February 1976, pp 133–142. This paper outlines a number of difficulties encountered in constructing such a filter using split-electrode charge transfer techniques. In such a transversal filter, the output signal is derived by repeatedly differentially summing the total of the sensed signals from one segment of each split-electrode from that of the others as mobile charges are transferred along the device. From Figure 15 of this paper it can be seen that in a typical filter, for a large majority of the split electrodes, only a small differential signal is developed between the two segments. As the paper points out, this results in the differential signal getting negligibly larger while the total electrode capacity continues to increase thereby resulting in a net decrease of signal voltage and a loss in signal-to-noise ratio.

STATEMENT OF THE INVENTION

The present invention substantially decreases this effect by utilizing a double split-electrode structure in which the sensing electrodes are divided into three segments of which only two are differentially sensed. The third non-sensing segment is clocked separately to insure that all mobile charge in each stage is transferred along the device. With this structure, the total electrode area connected to each sensing line is minimized thus reducing clock transient pickup, capacitive loading and the common mode signal which is applied to the differential amplifier. In addition to providing improved performance, this puts less constraints on the peripheral circuits for detection of the output signal.

Thus, the present invention relates to an improvement in a charge transfer device which is particularly adapted for use with transversal filters and the like and comprises: a charge storage body; a dielectric layer disposed over the body; and a plurality of storage electrodes disposed in a contiguous relationship over the dielectric layer for controlling the sequential transfer of mobile charges along a channel in the body in response to clock voltage signals applied thereto. The improvement in such a device comprises at least some of the storage electrodes being split into three segments along the direction of charge transfer whereby only two of every three segments are differentially summed.

One of the inherent problems in any split-electrode device is the ambiguity with which the charge divides beneath the sensing electrodes. In one method of forming such a device, a localized field oxide region or island is formed beneath the split in each electrode. An improvement in such a structure can be made by utilizing a narrow tongue on the leading edge of each localized region which extends partially under the previous storage electrode so that charge splitting commences earlier during the transfer operation. This narrow tongue also reduces the width of the ambiguous area and enhances the field in the splitting region.

The addition of this localized field oxide region reduces the active portions of the sensing electrodes. To compensate for this, one embodiment of the invention incorporates a notch at the side of the channel. The area of this notch is equal to one-half of the area under the localized oxide region, so that when the charge splits it occupies the same surface area beneath the split electrode that it occupied beneath a non-split electrode. This insures that the charge density and hence the surface potential of the split electrode remains the same under each sensing segment of the electrodes, thus minimizing the output distortion.

BRIEF DESCRIPTION OF THE DRAWINGS

An example embodiment of the invention will now be described with reference to the accompanying drawings in which.

DESCRIPTION OF THE PREFERRED EMBODIMENT

Figure 1:
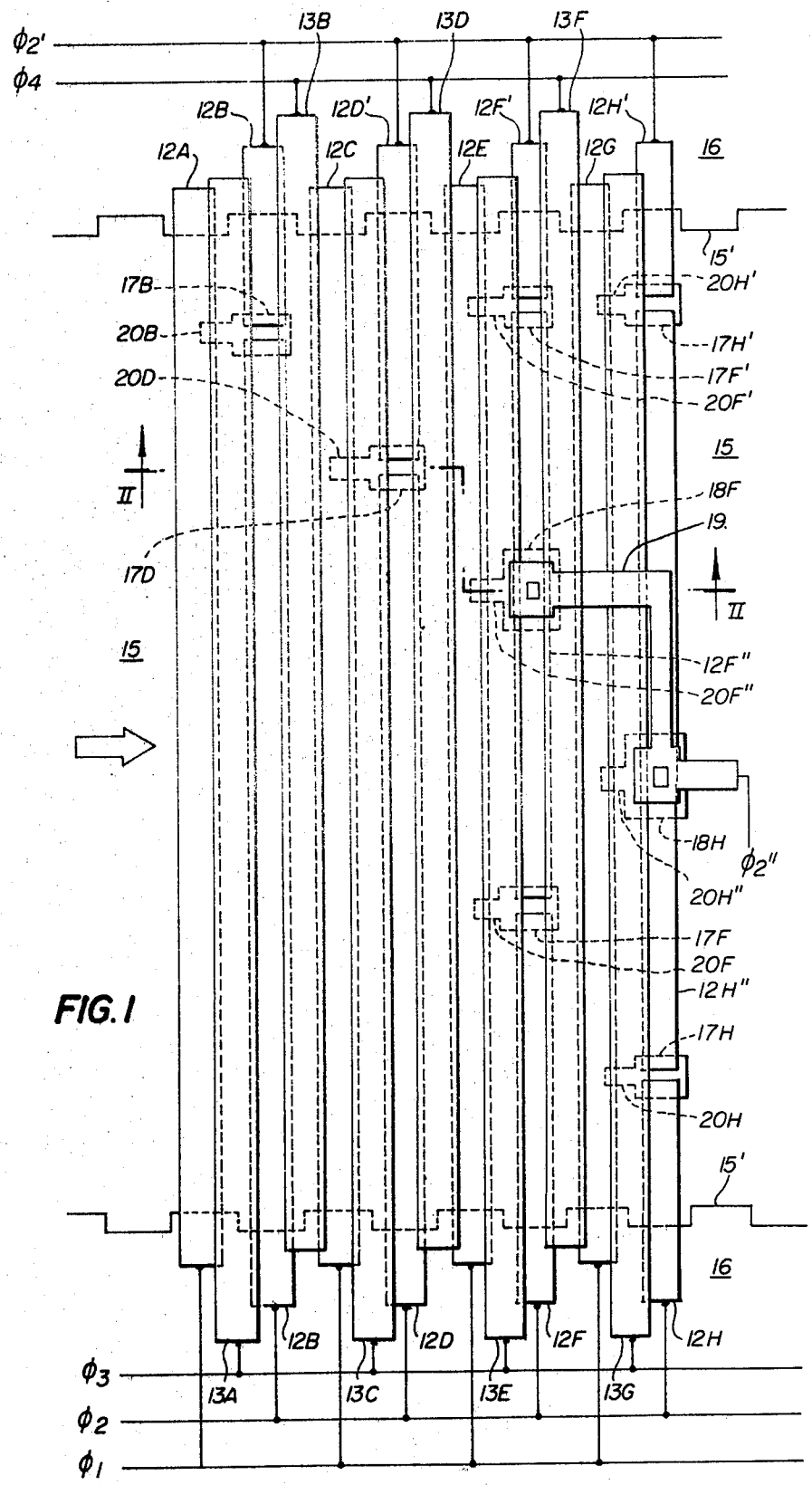
FIG. 1 illustrates a top plan view of a portion of a charge coupled device.

The fabrication of the charge coupled device described herein utilizes technologies well established and known in the semiconductor field. It is therefore considered unnecessary to describe in detail the individual steps for forming the device. However, U.S. Pat. No. 3,897,282 issued July 29, 1975 to James J. White, describes one method of constructing a two-level polysilicon charge coupled device which is the basic structure of the device disclosed herein. Also, it is evident that the figures shown in the drawings are exemplary of the construction of the invention and are not necessarily drawn to scale.

In the following detailed description and accompanying drawings, basic reference numbers will be assigned to individual elements of the device. Where it is necessary to distinguish between such elements, additional reference characters will be added to the base number. In general, reference will be made only to the base number.

Figure 2:
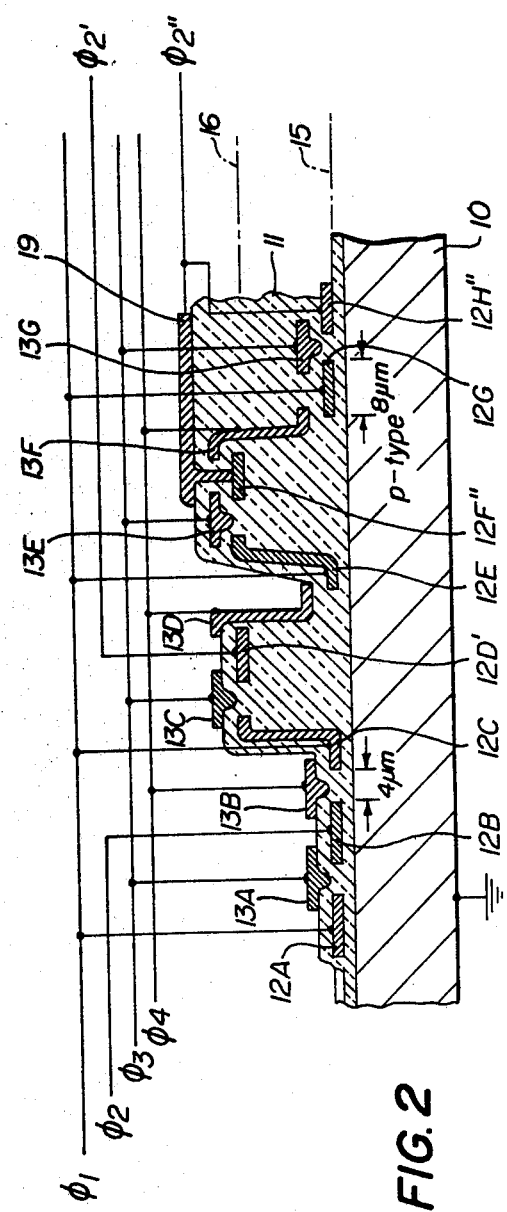
FIG. 2 illustrates a cross-sectional view of the portion of the device taken along the line II—II of FIG. 1.

Referring to FIGS. 1 and 2, the illustrated portion of the charge coupled device comprises a p-type silicon substrate 10 having a variable thickness silicon dioxide insulating layer 11 deposited thereon. A row of interleaved polysilicon storage electrodes 12 and transfer gates 13 laterally disposed so as to overlap adjacent ones, are deposited on the insulating layer 11.

As shown in FIG. 1, the silicon dioxide insulating layer 11 includes a gate oxide region 15 which defines the channel along which mobile charges are transferred under control of clock voltages applied to the electrodes 12 and 13. These gate oxide regions are delineated by thicker field oxide regions 16 which define the boundaries of the channel. The field oxide regions 16 are sufficiently thick that the portions of the semiconductor substrate 10 immediately beneath them do not invert in response to the application of clock voltages to the electrodes 12 and 13. Consequently, minority carrier charges are only carried along the substrate 10 in the channel defined by the gate oxide regions 15. In addition, small islands or regions 17 of field oxide are formed beneath each of the splits in the storage electrodes 12. In addition, for ease of manufacture field oxide regions 18 are also used where centre segments 12F″ and 12H″ of the split storage electrodes 12 are interconnected by a conductor 19. Each of the islands 17 and 18 has a narrow tongue 20 of field oxide which extends forward beneath a portion of the preceding electrode 12. The purpose of this tongue 20 is to initiate the division of charge beneath the split electrodes as it is being transferred from beneath the previous electrode so as to minimize any ambiguity and minimize the width of the splitting area.

In a typical split-electrode charge coupled device, charge sensing occurs beneath every second storage electrode. Consequently, storage electrodes 12A, 12C, 12E and 12G are non-split. Electrodes 12B and 12D are typical of the known single split electrodes which can be utilized in conjunction with the double split electrodes 12F and 12H of the present invention. Thus, where a large differential is required, the single split electrode (e.g. 12B) may be used whereas when a small differential exists the double split electrode (e.g. 12F) performs the same function.

Referring more specifically to FIG. 2, a typical CCD of th present invention has electrodes 12 and 13 which measure 8μm in the direction of charge flow that are separated from each other by a gap of 4μm, thus providing a 2μm overlap between adjacent storage electrodes 12 and transfer gates 13.

As can be seen from FIG. 1, the delineation 15′ between the gate oxide region 15 and the field oxide region 16 is stepped slightly wider beneath each of the split electrodes than beneath the non-split electrodes. The purpose of this is to allow for the reduced areas of the gate regions resulting from the field oxide islands 17 in the split electrode. The area of this step or notch is equal to one-half of the area under the preceding storage electrode adjacent to the splitting islands 17 so that when the charge splits it occupies the same surface area under the sensing electrodes 12B, 12D, 12F and 12H as it did under the previous non-split storage electrodes 12A, 12C, 12E and 12G. This insures that the charge density and surface potential remians the same under each sensing segment of the electrodes thus minimizing output distortion.

In operation, packets of charge are transferred down the channel 15 from left to right under control of clock voltages $\phi_1$, $\phi_2$, $\phi_2'$, $\phi_2''$, $\phi_3$ and $\phi_4$ by appropriately shifting the locations of the potential minima in a well known manner. Differential sensing of the change in voltage on lines $\phi_2$ and $\phi_2'$ resulting from the transfer charge beneath the segments of the electrodes connected thereto may be achieved using conventional differential amplifier techniques such as described in Section IV entitled "Clocking and Signal Recovery" of the article by Baertsch et al.

Clock $\phi_2''$ functions in unison with clocks $\phi_2$ and $\phi_2'$ so that the mobile charge is transferred simultaneously beneath the three segments of the double split electrodes. However only the two end segments 12F, 12H and 12F′, 12H′ are differentially sensed while the centre segments 12F″ and 12H″ function solely to transfer the balance of the mobile charge along the device so as to maintain a uniform charge density in the channel 15 beneath the double split electrodes. However this differential is achieved with a marked decrease in total capacitance of the sensing electroes 12F, 12F′, 12H and 12H′.

This is particularly evident in the double split electrode 12H where the differential between the two end segments 12H and 12H′ is comparatively small, and the non-sensed centre segment 12H″ covers over 80% of the width of the channel 15.

As pointed out previously, where a very large differential is required such as in electrode 12B, the conventional single split electrode is used instead of one that is double split. Thus a single device may utilize both types advantageously.

The Baertsch et al article also discloses the use of a parallel channel on one side (FIG. 15) to balance the total capacity between the two sets of sensing electrodes. Since etching techniques are not perfect, an improved balance can be achieved by including a narrow channel on the other side. Again the areas of these channels are such as to balance the total capacity of the two sides. However, any over or under etching of the device during the formation of one parallel channel is compensated for by an equal over or under etching in the other.

What is claimed is:

1. In a charge transfer device for transversal filters and the like, comprising:
   a storage body;
   a dielectric layer disposed over the body;
   an input for mobile charges into the body;
   a plurality of interleaved storage electrodes and transfer gates, disposed over the dielectric layer for controlling the sequential transfer of mobile charges from the input along a channel in said body in response to clock voltages applied thereto;
   the improvement comprising:
   at least some of the alternate ones of said storage electrodes being split along the direcion of charge transfer into three segments;
   means for connecting one set of end segments together and for connecting the other set of end segments together for differential sensing; and
   means for connecting the centre segments for non-sensing whereby the total capacity of the differentially sensed end segments is reduced.

2. A charge transfer device as defined in claim 1 in which:
   the dielectric layer is divided into thin gate oxide regions and thick field oxide regions, the intersection of which defines the boundaries of said channel in said body;
   a localized field oxide region beneath each of the splits in the storage electrodes, the localized field oxide region having a narrow tongue extending towards the input beneath a portion of the immediately preceding storage electrode to further define the split of said mobile charges being transferred along said channel.

3. A charge transfer device as defined in claim 2 in which:
   the width of the channel beneath each split electrode is extended laterally to compensate for the reduced width of the channel resulting from the localized field oxide regions beneath said splits;
   so that the charge density beneath at least the sensed portions of the split electrodes, is the same as that beneath the non-split storage electrodes.

4. In a charge transfer device for transversal filters and the like, comprising:
a charge storage body;
a dielectric layer disposed over the body;
a plurality of storage electrodes disposed in a contiguous relationship over the dielectric layer for controlling the sequential transfer of mobile charges along said body in response to clock voltages applied thereto;
the improvement comprising:
at least some of said storage electrodes being split along the direction of charge transfer into three segments; and
means for coupling only two of every three segments, for differential sensing.

5. In a charge coupled device for transversal filters and the like, comprising:
a charge storage body;
a dielectric layer disposed over the body;
a plurality of storage electrodes disposed in a contiguous relationship over the dielectric layer for controlling the transfer of mobile charges along a channel in said body in response to clock voltages applied thereto;
the improvement comprising:
at least some of said storage electrodes being split in the direction of charge transfer into three segments;
means for connecting the respective end segments together for differential sensing; and
means for connecting the centre segments together for non-sensing.

* * * * *